(12) United States Patent
Nakayama

(10) Patent No.: US 7,231,195 B2
(45) Date of Patent: Jun. 12, 2007

(54) VARIABLE GAIN CONTROL CIRCUIT AND RECEIVER APPARATUS USING THE CIRCUIT

(75) Inventor: Takashi Nakayama, Chiba (JP)

(73) Assignee: Sony Ericsson Mobile Communications Japan, Inc., Tokyo (JP)

( * ) Notice: Subject to any disclaimer, the term of this patent is extended or adjusted under 35 U.S.C. 154(b) by 331 days.

(21) Appl. No.: 10/939,472

(22) Filed: Sep. 14, 2004

(65) Prior Publication Data
US 2005/0107054 A1    May 19, 2005

(30) Foreign Application Priority Data
Sep. 16, 2003    (JP)    ............. P2003-322458

(51) Int. Cl.
H04B 7/00    (2006.01)
H04B 1/07    (2006.01)

(52) U.S. Cl. ............... 455/251.1; 455/234.1; 455/253.2

(58) Field of Classification Search .......... 455/311, 455/251.1, 253.2, 245.1, 245.2, 136, 219, 455/250.1, 232.1, 234.1
See application file for complete search history.

(56) References Cited

U.S. PATENT DOCUMENTS

| | | | |
|---|---|---|---|
| 4,066,977 | A | 1/1978 | Chambers et al. |
| 5,734,974 | A | 3/1998 | Callaway, Jr. et al. |
| 5,898,912 | A | 4/1999 | Heck et al. |
| 5,943,612 | A | 8/1999 | Dick |
| 6,181,201 | B1 | 1/2001 | Black |
| 6,240,100 | B1 | 5/2001 | Riordan et al. |
| 6,498,926 | B1 | 12/2002 | Ciccarelli et al. |
| 6,498,929 | B1 | 12/2002 | Tsurumi et al. |
| 6,516,185 | B1 | 2/2003 | MacNally |
| 6,985,705 | B2 * | 1/2006 | Shohara ............... 455/164.1 |

(Continued)

FOREIGN PATENT DOCUMENTS

EP    0 413 311 A2    2/1991

(Continued)

OTHER PUBLICATIONS

Patent Abstracts of Japan, JP 2003-224488, Aug. 8, 2003 (corr. US 2004/0097212).

*Primary Examiner*—Sonny Trinh
(74) *Attorney, Agent, or Firm*—Oblon, Spivak, McClelland, Maier & Neustadt, P.C.

(57) ABSTRACT

Disclosed is a variable gain control circuit for executing automatic-gain-control on a variable gain amplification block composed of a plurality of amplifiers on which discrete gain setting is executed by a programmable-gain-amp method. A baseband amplifier (a variable gain amplifier) is composed of a plurality of amplifiers on which discrete gain setting is executed by a programmable-gain-amp method. A programmable-gain-amp control processing block references a programmable-gain-amp control data table on the basis of a difference between a current receive signal level and a predetermined receive signal level to determine the gain of the baseband amplifier, thereby making a programmable-gain-amp data generator generate programmable-gain-amp data. A programmable-gain-amp control processing block references a direct-current offset cancel table on the basis of current programmable-gain-amp data and next programmable-gain-amp data to generate corresponding direct-current offset cancel data, converts the generated direct-current offset cancel data into an analog voltage, and adds the analog voltage to the baseband amplifier output.

16 Claims, 16 Drawing Sheets

U.S. PATENT DOCUMENTS

2003/0064696 A1*  4/2003  Akamine et al. ........... 455/311
2003/0087617 A1*  5/2003  Shohara ................... 455/192.2
2004/0097212 A1   5/2004  Matsumoto et al.
2004/0171365 A1*  9/2004  Godambe et al. ........ 455/232.1
2005/0136872 A1*  6/2005  Yoshizawa et al. ...... 455/232.1

FOREIGN PATENT DOCUMENTS

WO    WO 01/37436 A2    5/2001
WO    WO 03/013012 A1   2/2003

* cited by examiner

F I G. 9

| DIFFERENCE BETWEEN CURRENT VALUE AND OPTIMUM VALUE OF RECEIVE SIGNAL LEVEL | PGA DATA |
|---|---|
| LEVEL△1 | PGADATA 1 |
| LEVEL△2 | PGADATA 2 |
| ... | ... |

F I G. 1 0

| CURRENT PGA DATA | NEXT PGA DATA | OFFSET CANCEL TABLE |
|---|---|---|
| PGADATA 1 | PGADATA 2 | OFFSET 1 |
| PGADATA 1 | PGADATA 3 | OFFSET 2 |
| ⋮ | ⋮ | ⋮ |
| PGADATA 2 | PGADATA 3 | OFFSET 3 |
| PGADATA 2 | PGADATA 4 | OFFSET 4 |
| ⋮ | ⋮ | ⋮ |

CURRENT PGA DATA < NEXT PGA DATA

FIG. 11A

| DIFFERENCE BETWEEN CURRENT PGA DATA AND NEXT PGA DATA | OFFSET CANCEL AMOUNT |
|---|---|
| PGADATA△1 | OFFSET 10 |
| PGADATA△2 | OFFSET 11 |
| PGADATA△3 | OFFSET 12 |
| ⋮ | ⋮ |

| CURRENT PGA DATA | NEXT PGA DATA | OFFSET CANCEL AMOUNT |
|---|---|---|
| PGADATAX1 | PGADATAX2 | OFFSET 1 |
| PGADATAX3 | PGADATAX4 | OFFSET 2 |
| ⋮ | ⋮ | ⋮ |

| CURRENT PGA DATA | NEXT PGA DATA |
|---|---|
| PGADATAX11 | PGADATAX12 |
| PGADATAX13 | PGADATAX14 |
| PGADATAX15 | PGADATAX16 |
| ⋮ | ⋮ |

321

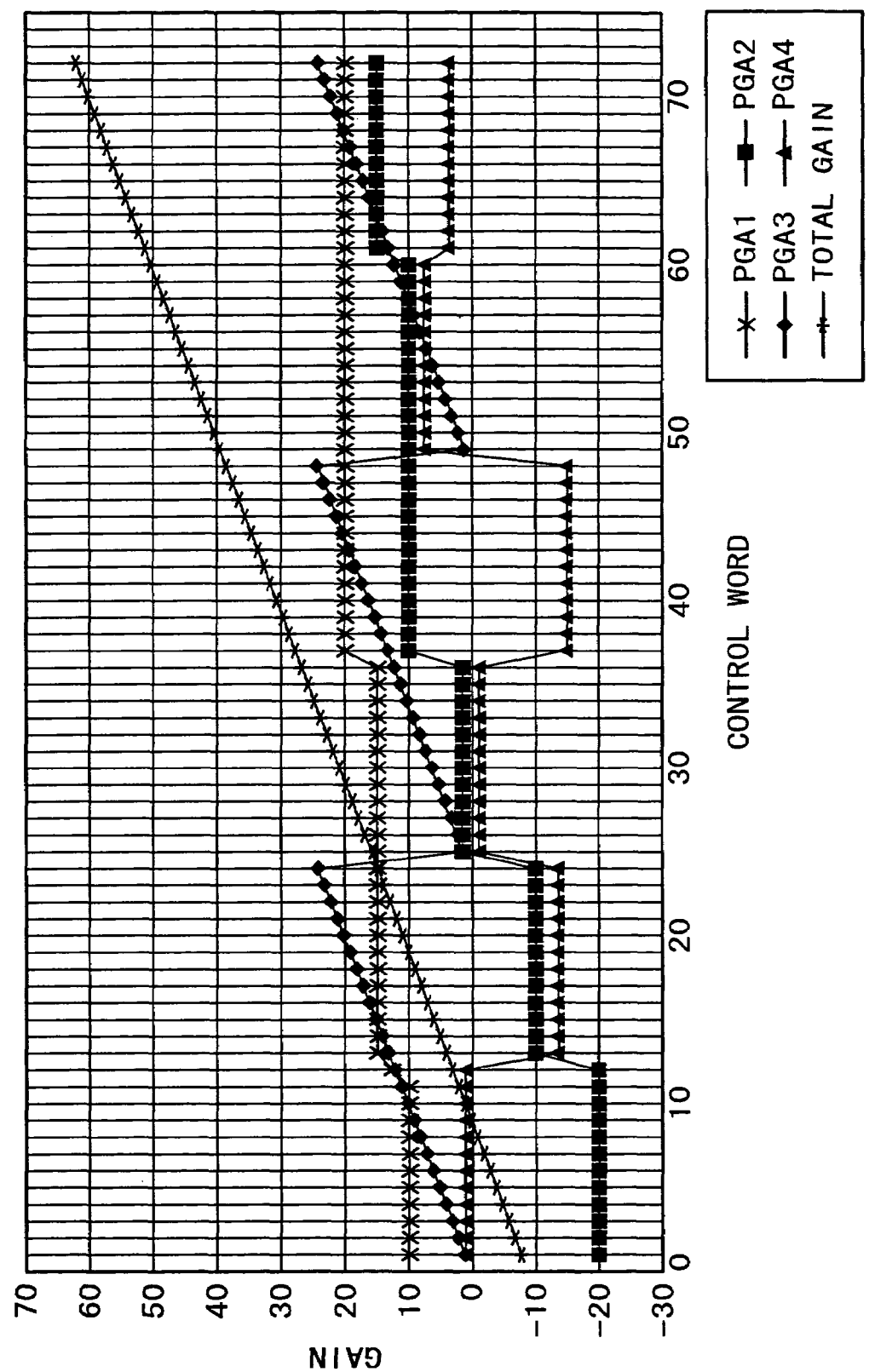

VARIABLE GAIN CONTROL CIRCUIT AND RECEIVER APPARATUS USING THE CIRCUIT

BACKGROUND OF THE INVENTION

The present invention relates generally to a variable gain control circuit and a receiver apparatus using this variable gain control circuit.

Referring to FIG. 1, there is shown a configuration of a direct conversion receiver for use in a DS-CDMA (Direct Sequence Code Division Multiple Access) mobile communication system for performing AGC (Automatic Gain Control) by a general analog voltage signal. In the figure, reference numeral 300 denotes an RF-IC which contains a baseband amplifier (or a variable gain amplifier) (the same holds with other accompanying drawings).

A signal received by a terminal apparatus (hereafter referred to simply as a terminal) at its external antenna is differentially amplified by a low-noise amplifier 301 to be divided into two. The direct current component is cut by a capacitor (this is called C-cut) and the resultant signal is down-converted from RF signal to baseband signal at a stretch by a quadrature mixer 302. At this moment, the RF signal is mixed with a signal with a local oscillation signal (LO) supplied from a local oscillator 304 divided by a divider 303 into in-phase component (I) and quadrature component (Q), so that baseband signals having in-phase component and quadrature component are generated. These baseband signals are each removed by a lowpass filter (LPF) 305 of the signal power of the interference wave of an adjacent channel for example, thereby providing only a desired wave signal. Next, each resultant baseband signal is amplified by a baseband amplifier 306 with its gain variably controlled by an analog voltage 309. An LPF 307 subsequent to the baseband amplifier 306 is a filter inserted to make a 50% roll-off characteristic downlink signal at the sender side be 100% roll-off characteristic as a total transfer function. After maximizing the S/N of the baseband signal through the LPF 307, the resultant baseband signal is quantized through an A/D converter 308 to be converted from analog to digital signal. The above-mentioned analog voltage signal 309 is also referred to as an AGC signal, which is controlled by a baseband signal processing block (not shown) so that the baseband signal received at the A/D converter 308 always has a optimum dynamic range.

However, it is difficult for the AGC control based on an analog voltage signal to provide precision AGC control due to wide variations between component parts of and between temperatures in the baseband amplifier 306. Especially, the problem of these variations is serious because the amplitude deflection of I and Q signals affects BER (Bit Error Rate) characteristic. In addition, BER characteristic is also affected by the digital noise on the board, thereby requiring to arrange an RC LPF (not shown) at the AGC input terminal.

To circumvent the above-mentioned problems, a configuration is receiving attention in which a PGA (Programmable Gain Amplifier) variable by 3-wire serial data setting is used instead of the AGC control based on the analog voltage signal 309. Three-wire signals are data, clock, and strobe signals. In synchronization with a clock signal, data are captured by shifting them in a serial manner and the captured data are latched in accordance with a strobe signal. Since the PGA is digitally controlled, it is hardly affected by the fluctuations in component part or temperature, thereby realizing precision setting of the gains of I and Q signals.

Further, a high linearity of the baseband amplification block may be achieved by switching each linear resistor.

[Patent Document 1]

Japanese Patent Laid-Open No. 2001-36358

As described above, the PGA method is advantageous in various points as the ACG controlling for the direct conversion receiver, but at the cost of the following problems.

FIG. 2 is a configuration diagram illustrating a direct conversion receiver apparatus for use in a DS-CDMA mobile communication system with its AGC control based on PGA.

Instead of the AGC control based on the analog voltage signal 309, 3-wire serial digital data 312 are set and decoded by a PGA control circuit 311, thereby discretely switching the gains of baseband amplifiers 306. A DC offset canceller circuit 310 detects the DC component at the final stage of the baseband amplifier to apply negative feedback in an analog manner, thereby canceling the DC offset (refer to Patent Document 1). Although not shown in the block diagram of FIG. 1, the DC offset canceller circuit 310 is also usually installed on the direct conversion receiver in which AGC control is executed by the analog voltage signal described with reference to FIG. 1. As described above, the PGA method decodes the 3-wire serial digital data 312 by the PGA control circuit 311 to discretely switching the gains of baseband amplifiers 306. Suppose here the case in which gains are switched from one to another by 1 dB upward.

The following briefly describes this case with reference to FIG. 3. It is supposed that, if the PGA data for the sequence of differential amplifiers configuring the a baseband amplification block change from "0111" to "1000", the first stage amplifier which has been off be switched by the PGA control circuit 311 from 0 dB to 20 dB, the subsequent three amplifiers providing a gain which is 19 dB less than the current gain. As a total gain, only 1 dB is added. However, in this differential amplifier sequence, the discrete switching of gains causes a stepwise DC offset due to the variation in transistor pair. Depending on manufacturing processes, this DC offset may reach several mV or higher on the input basis. Hence, largely switching the gain at the initial stage of the amplifier sequence results in a fairly large DC offset at the final stage. This stepwise DC offset component due to the gain switching is not affected by the C-cut and therefore interferes the desired wave signal component, thereby deteriorating the S/N.

FIG. 4 shows how the above-mentioned stepwise DC offset interferes the desired wave signal. As shown in the figure, the stepwise DC offset component that is interfering is indicated by a hatched portion, in a wideband desired wave signal, generated by Fourier transform.

In the above-mentioned circuit shown in FIG. 2, the DC offset canceller circuit 310 is mounted, but, due to the circuit configuration based on analog negative feedback, a waveform as shown in FIG. 5 is obtained in the IQ output at the final stage. The large glitch component at gain switching shown in FIG. 5 saturates the A/D converter 308 shown in FIG. 2, thereby pushing up the moving average deviations necessary for AGC control which are computed from the received IQ signal. If the frequency of this glitch increases, the moving average deviations eventually converge to the AGC value which depends on the glitch value. Consequently, proper AGC control is not performed on each regular receive signal and therefore the level set lower than the optimum level in the A/D converter 308, resulting in a deteriorated reception characteristic due to quantization noise.

Generally, in analog DC offset canceller circuits, the time of DC level convergence is related with the cutoff frequency of the LPF at the time of DC feedback. If the cutoff frequency of the LPF is around 5 kHz, it takes around 100 microseconds or more for DC offset convergence. Hence, a method has recently been proposed in which the gain is set by the PGA and then the cutoff frequency of the LPF is temporarily lifted up to around 100 to 200 kHz for about 10 microseconds for example, thereby increasing the speed of DC offset convergence. Further, to take actions against the glitch component adversely affecting AGC control, a method has been proposed in which the IQ signal data in a period of 10 microseconds in the above-mentioned method are masked at the output stage, thereby preventing the waveform shown in FIG. 5 from being outputted.

On the other hand, the standardization is currently in progress on the DS-CDMA method at 3GPP (3rd Generation Partnership Project) and its specifications define a signal having SF (Spreading Factor)=4 as downlink DPCH (Dedicated Physical Channel) signal. In this case, the data length of one symbol is 1 microsecond, so that if the IQ signal is masked for a period of 10 microseconds as described above, about 10 symbols of data are lost.

SUMMARY OF THE INVENTION

It is therefore an object of the present invention to provide a variable gain control circuit and a receiver apparatus using this circuit in which a variable gain amplification block configured by a plurality of amplifiers with their gains discretely set by the PGA method is AGC-controlled to significantly reduce the influence of an interference component caused by a DC offset which is generated at the time of gain switching.

Another object of the present invention is to reduce the influence of the interference component due to a DC offset which is generated at the time of gain switching if the PGA method is used in the direction conversion receiver apparatus, without losing the symbol data when the spreading factor is small (SF=4) as a downlink DPCH signal, thereby realizing good reception characteristics.

According to the first aspect of the present invention, there is provided a variable gain control circuit for executing automatic-gain-control on a variable gain amplification block composed of a plurality of amplifiers to which gains are discretely set by a programmable-gain-amp method, including:

level detection means for detecting a current amplifier output level;

programmable-gain-amp control data storage means for storing programmable-gain-amp data corresponding to a difference between a current amplifier output level and a predetermined amplifier output level;

programmable-gain-amp data generating means for generating programmable-gain-amp data for controlling a gain of the variable gain amplification block on the basis of an output of the programmable-gain-amp control data storage means;

direct-current offset cancel storage means for storing beforehand direct-current offset cancel data corresponding to a direct-current offset voltage of an amplifier output which occurs when discrete gain switching of the variable gain amplification block is executed from currently set programmable-gain-amp data to programmable-gain-amp data to be set next; and control means for referencing the direct-current offset cancel storage means on the basis of currently set programmable-gain-amp data and programmable-gain-amp data to be set next to generate corresponding direct-current offset cancel data; and means for converting the generated direct-current offset cancel data into an analog voltage and adds the analog voltage to an amplifier output.

According to the second aspect of the present invention, there is provided a variable gain control circuit for executing automatic-gain-control on a variable gain amplification block composed of a plurality of amplifiers to which gains are discretely set by a programmable-gain-amp method, including:

level detection means for detecting a current amplifier output level;

gain control means for controlling a gain of the variable gain amplification block in accordance with a difference between a current amplifier output level and a predetermined amplifier output level;

direct-current offset cancel storage means for storing beforehand direct-current offset cancel data corresponding to a direct-current offset voltage of an amplifier output which occurs when discrete gain switching of the variable gain amplification block is executed from currently set programmable-gain-amp data to programmable-gain-amp data to be set next; and means for referencing the direct-current offset cancel storage on the basis of currently set programmable-gain-amp data and programmable-gain-amp data to be set next to generate corresponding direct-current offset cancel data and converting the generated direct-current offset cancel data to an analog voltage, thereby canceling a direct-current offset of an amplifier output.

According to the third aspect of the present invention, there is provided a variable gain control circuit for executing automatic-gain-control on a variable gain amplification block having an analog direct-current offset cancel circuit and a mask hold circuit for holding a direct-current level by masking an amplifier output, the variable gain control block composed of a plurality of amplifiers to which gains are discretely set by a programmable-gain-amp method, including:

level detection means for detecting a current amplifier output level;

programmable-gain-amp data generating means for generating programmable-gain-amp data for controlling a gain of the variable gain amplification block and an operation of the mask hold circuit in accordance with a difference between a current amplifier output level and a predetermined amplifier output level; and control means for determining whether to execute mask processing by the mask hold circuit in accordance with a result of a comparison between a direct-current offset of an amplifier output which occurs when discrete gain switching of the variable gain amplification block is executed from current set programmable-gain-amp data to programmable-gain-amp data to be set next and a predetermined threshold value, controlling programmable-gain-amp data switching in a predetermined timed relation, determining an on/off status of a direct-current offset cancel operation of the direct-current offset cancel circuit on the basis of the result of the comparison, temporarily speeding up the convergence of a direct-current offset by the direct-current offset cancel circuit only when the direct-current offset exceeds the predetermined threshold value, and controlling the programmable-gain-amp data generating means to execute an operation of masking an amplifier output of a period concerned for a predetermined time.

According to the fourth aspect of the present invention, there is provided a variable gain control circuit for executing automatic-gain-control on a variable gain amplification block composed of a plurality of amplifiers to which gains are discretely set by a programmable-gain-amp method, wherein gain switching of each amplifier in the gain control amplification block is controlled such that the gain switching is provided with hysteresis.

According to the fifth aspect of the present invention, there is provided a receiving apparatus for executing automatic-gain-control by a programmable-gain-amp method on a variable gain amplifier in a receiver for use in a mobile communication system, including:

a variable gain amplification block composed of a plurality of amplifiers to which gains are discretely set by a programmable-gain-amp method;

a receive signal level computing unit for computing a current receive signal level;

a programmable-gain-amp control data table in which programmable-gain-amp data are stored in accordance with a difference between a current receive signal level and a predetermined receive signal level;

a direct-current offset cancel table to which digital data are written beforehand in accordance with a direct-current offset voltage at the last one of the plurality of variable gain amplifiers which occurs when discrete gain switching is executed from currently set programmable-gain-amp data to programmable-gain-amp data to be set next;

a programmable-gain-amp control processing block for generating programmable-gain-amp data for controlling the plurality of variable gain amplifiers by referencing the programmable-gain-amp control data table and generating direct-current offset cancel data by referencing the direct-current offset cancel table; and a digital-to-analog converter for converting the direct-current offset cancel data into an analog voltage and adding the analog voltage to the output of the variable gain amplification block.

According to the sixth aspect of the present invention, there is provided a receiving apparatus for executing automatic-gain-control on a variable gain amplifier in a receiver by a programmable-gain-amp method, including:

a variable gain amplification block composed of a plurality of amplifiers on which discrete gain setting is executed by a programmable-gain-amp method;

a mask hold circuit for masking an output of an analog direct-current offset cancel circuit arranged in the variable gain amplification block and an output of the variable gain amplification block, thereby holding a direct-current level;

a receive signal level computing unit for computing a current receive signal level;

programmable-gain-amp data generating means for generating programmable-gain-amp data for controlling a gain of the variable gain amplification block and an operation of the mask hold circuit in accordance with a difference between a current receive signal level and a predetermined optimum receive signal level; and control means for determining whether to execute mask processing by the mask hold circuit in accordance with a result of a comparison between a direct-current offset of an amplifier output which occurs when discrete gain switching of the variable gain amplification block is executed from currently set programmable-gain-amp data to programmable-gain-amp data to be set next and a predetermined threshold value, controlling programmable-gain-amp data switching in a predetermined timed relation, determining an on/off status of a direct-current offset cancel operation of the direct-current offset cancel circuit on the basis of the result of the comparison, temporarily speeding up the convergence of a direct-current offset by the direct-current offset cancel circuit only when the direct-current offset exceeds the predetermined threshold value, and controlling the programmable-gain-amp data generating means to execute an operation of masking an amplifier output of a period concerned for a predetermined time.

According to the seventh aspect of the present invention, there is provided a receiving apparatus including:

a variable gain amplification block composed of a plurality of amplifiers to which discrete gain setting is executed by a programmable-gain-amp method; and control means for executing automatic-gain-control on the amplification block;

wherein, the control means executes gain switching control on each of the plurality of amplifiers such that hysteresis is provided to the gain switching of each of the plurality of amplifiers.

According to the eighth aspect of the present invention, there is provided a receiving apparatus for executing automatic-gain-control by a programmable-gain-amp method on variable gain amplification means in a receiver for use in a mobile communication system, including:

variable gain amplification means composed of a plurality of amplification means to which discrete gain setting is executed by a programmable-gain-amp method;

receive signal level computing means for computing a current receive signal level;

programmable-gain-amp control data storage means in which programmable-gain-amp data are stored in accordance with a difference between a current receive signal level and a predetermined receive signal level;

direct-current offset cancel storage means to which digital data are written beforehand in accordance with a direct-current offset voltage at the last one of the plurality of amplification means which occurs when discrete gain switching is executed from currently set programmable-gain-amp data to programmable-gain-amp data to be set next;

programmable-gain-amp control processing means for generating programmable-gain-amp data for controlling the plurality of amplification means of the variable gain amplification means by referencing the programmable-gain-amp control data storage means and generating direct-current offset cancel data by referencing the direct-current offset cancel storage means; and digital-to-analog conversion means for converting the direct-current offset cancel data into an analog voltage and adding the analog voltage to the output of the variable gain amplification means.

According to the ninth aspect of the present invention, there is provided a receiving apparatus for executing automatic-gain-control on variable gain amplification means in a receiver by a programmable-gain-amp method, including:

variable gain amplification means composed of a plurality of amplification means on which discrete gain setting is executed by a programmable-gain-amp method;

mask hold means for masking an output of analog direct-current offset cancel means arranged in the variable gain amplification means and an output of the variable gain amplification means, thereby holding a direct-current level;

receive signal level computing means for computing a current receive signal level;

programmable-gain-amp data generating means for generating programmable-gain-amp data for controlling a gain of the variable gain amplification means and an operation of the mask hold means in accordance with a difference between a current receive signal level and a predetermined optimum receive signal level; and control means for determining whether to execute mask processing by the mask hold means in accordance with a result of a comparison between a direct-current offset of amplification means output which occurs when discrete gain switching of the variable gain amplification means is executed from currently set programmable-gain-amp data to programmable-gain-amp data to be set next and a predetermined threshold value, controlling programmable-gain-amp data switching in a predetermined timed relation, determining an on/off status of a direct-current offset cancel operation of the direct-current offset cancel circuit on the basis of the result of the comparison, temporarily speeding up the convergence of a direct-current offset by the direct-current offset cancel means only when the direct-current offset exceeds the predetermined threshold value, and controlling the programmable-gain-amp data generating means to execute an operation of masking amplification means output of a period concerned for a predetermined time.

BRIEF DESCRIPTION OF THE DRAWINGS

These and other objects of the invention will be seen by reference to the description, taken in connection with the accompanying drawing, in which:

FIG. 9 shows an exemplary configuration of a PGA control data table shown in FIG. 6;

FIG. 10 shows an exemplary configuration of a DC offset cancel table shown in FIG. 6;

FIGS. 11A and 11B show another exemplary configuration of the DC offset cancel table shown in FIG. 6;

FIG. 13 shows an exemplary configuration of a mask enabling table in the second embodiment of the invention;

FIG. 15A is a graph indicative of a manner of gain switching of each stage of a baseband amplification block based on a related-art control method.

DETAILED DESCRIPTION OF THE PREFERRED EMBODIMENTS

[First Embodiment]

The first embodiment of the invention is based on a concept that a stepwise DC offset component generated by digitally setting gains on the basis of PGA method is digitally canceled as a system, thereby solving the problems inherent to analog offset cancel operations to realize ideal AGC control.

The first embodiment of the invention will be described in further detail by way of example with reference to the accompanying drawings.

Figure 6:
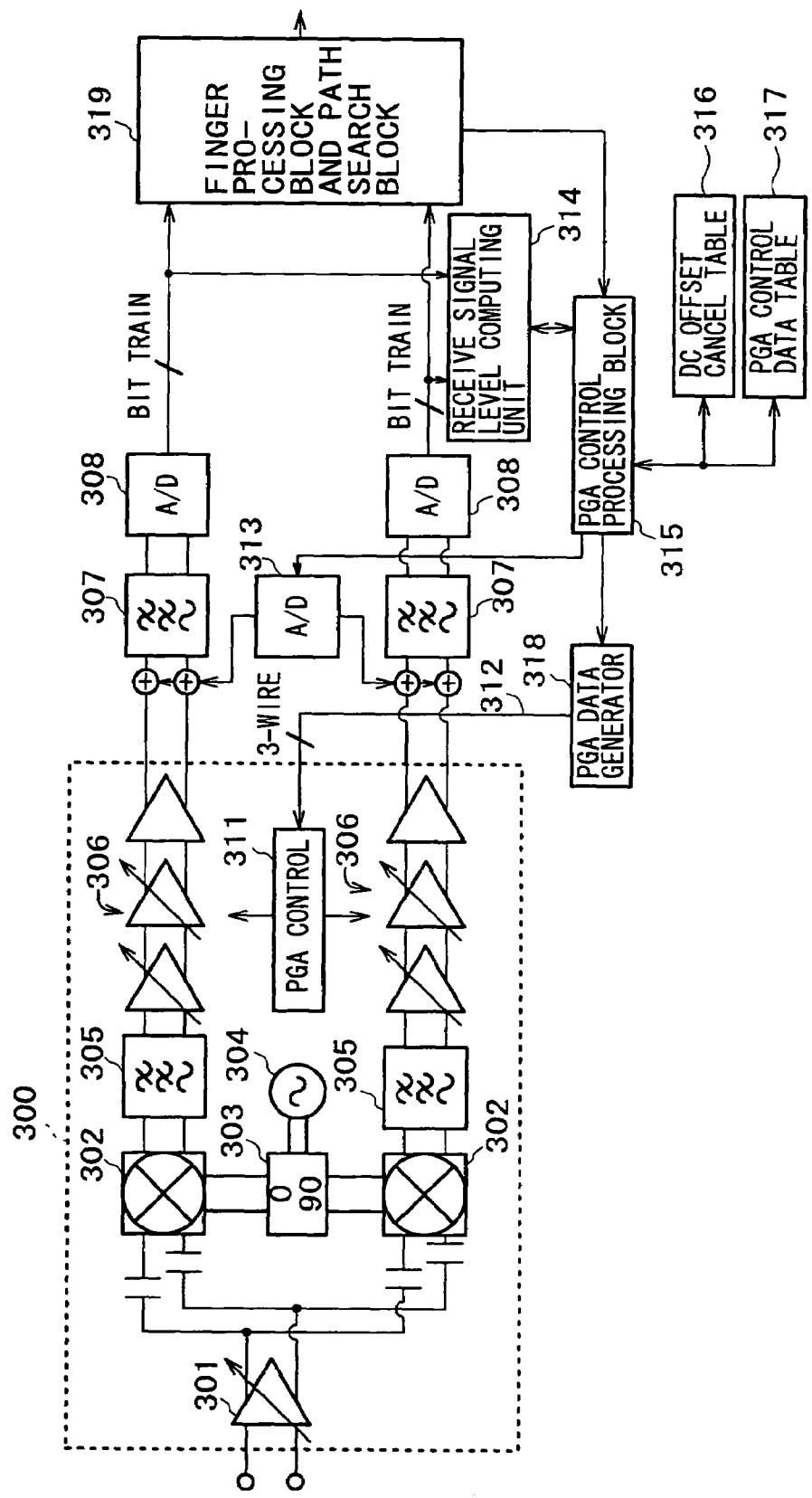
FIG. 6 is a block diagram illustrating a configuration of a receiver apparatus, practiced as a first embodiment of the invention, in the case where a direct conversion receiver based on PGA method is used in a DS-CDMA mobile communication system.

Now, referring to FIG. 6, there is shown a block diagram of an exemplary configuration of a receiver apparatus in which a PGA-based direct conversion receiver is used in a DS-CDMA mobile communication system, practiced as the first embodiment of the invention. As shown in FIG. 6, as described in the related-art section hereof, a signal received by a terminal at its external antenna is differentially amplified by a low-noise amplifier 301 to be divided into two. Each differentially amplified signal is C-cut of its direct-current component, subsequently down-converted from RF signal to baseband signal by a quadrature mixer 302 at a stretch. At this moment, to mix with a signal obtained by dividing an LO signal from a local oscillator 304 into an in-phase component and a quadrature component by a divider 303, an in-phase component signal and a quadrature component signal are generated in the baseband. These baseband signals are removed of an interference wave signal power of an adjacent channel for example by an LPF 305, thereby extracting only a desired wave signal. Next, 3-wire serial digital data 312 are decoded by the PGA control circuit 311 and the baseband signals are amplified by discretely switching the gains of a baseband amplifier 306. An LPF 307 is a filter inserted to convert a 50% roll-off characteristic downlink signal at the sender side into a 100% roll-off characteristic downlink signal as a total transfer function. The S/N of the baseband signals are maximized by the LPF 307 and then the maximized signals are quantized by an A/D converter 308 from analog to digital. The quantized signals are sent to a finger processing block and path search block 319 which constitutes a baseband signal processing block. In the finger processing block and path search block 319, decode processing including rake synthesis and error correction is performed on the quantized signals, which is not described in detail herein, thereby correctly decoding the downlink signal received from a base station.

The following describes the details of the AGC control method based on the PGA method according to the invention.

Concurrently with the processing by the finger processing block and path search block 319, digital signal processing is performed on the IQ baseband signal quantized by the A/D converter 308 by a receive signal level computing unit 314. In computation of the receive signal level, the receive signal level computing unit 314 executes averaging processing to remove the influence of the instantaneous change in the receive envelope level which is Rayleigh-scattered by phasing. This processing is executed, by use of an averaged time as a parameter which can be set as desired by a PGA control processing block 315. The PGA control processing block 315 may be constituted by a digital signal processor (DSP) for example. This parameter is set on the basis of a simulation or actual measurement data.

The PGA control processing block 315 makes a comparison between the value of the receive signal level preset to get the optimum input level in the A/D converter 308 and the value of the current receive level obtained in the receive signal level computing unit 314. On the basis of the result of the comparison, the PGA control processing block 315 selects the optimum PGA data from a PGA control data table 317 and sends the selected optimum PGA data to a PGA data generator 318. The PGA data generator 318 adds other bits such as address bits to the received PGA data to generate 3-wire serial digital data 312 which is supplied to the PGA control circuit 311.

FIG. 9 shows an exemplary configuration of this PGA control data table 317. This table defines the PGA data to be used for the difference between the current value of the receive signal level and the optimum value thereof. The table values in the figure are indicated by variables for the sake of convenience; actually, however, they are particular values (the same holds true with other tables to be described later).

Suppose here that the maximum gain of the baseband amplifier 306 be 80 dB for example, then the operation of the first initial AGC pull-in from the power-on operation is as follows. In this case, the initial cell search operation is performed, so that it is necessary to be able to receive P-SCH, S-SCH, and P-CPICH which are always transmitted from a base station. For the initial value of PGA data, the PGA control processing block 315 sets 40 dB which is half the maximum gain of the baseband amplifier 306. At this moment, if the receive signal level obtained by the receive signal level computing unit 314 is found to be greater than the preset receive signal level, then the gain is decreased by that difference; if smaller, then the gain is increased by that difference.

Namely, the PGA data in the PGA control data table 317 can be restricted, at maximum, to the PGA data equivalent to that the gain variation is half (40 dB) the above-mentioned maximum gain. On the other hand, in the actual mobile communication environment, the instantaneous receive level varies by approximately 20 to 30 dB due to Rayleigh phasing, which presents no problem because the receive signal level computing unit 314 executes averaging to remove the influence of the variation.

A DC offset cancel table 316 contains, as shown in FIG. 10, the digital data corresponding to the DC offset voltages at the final stage which are generated when discretely switching gains from currently set PGA data to the PGA data to be set next. The PGA control processing block 315 recognizes both the currently set PGA data and the PGA data to be set next, so that the PGA control processing block 315 selects the optimum DC offset cancel data by referencing the DC offset cancel table 316 and sends the selected DC offset cancel data to a digital-to-analog converter 313. The digital-to-analog converter 313 converts the received DC offset cancel data into an analog voltage and adds it to an IQ output signal of the direct conversion receiver.

Figure 7:
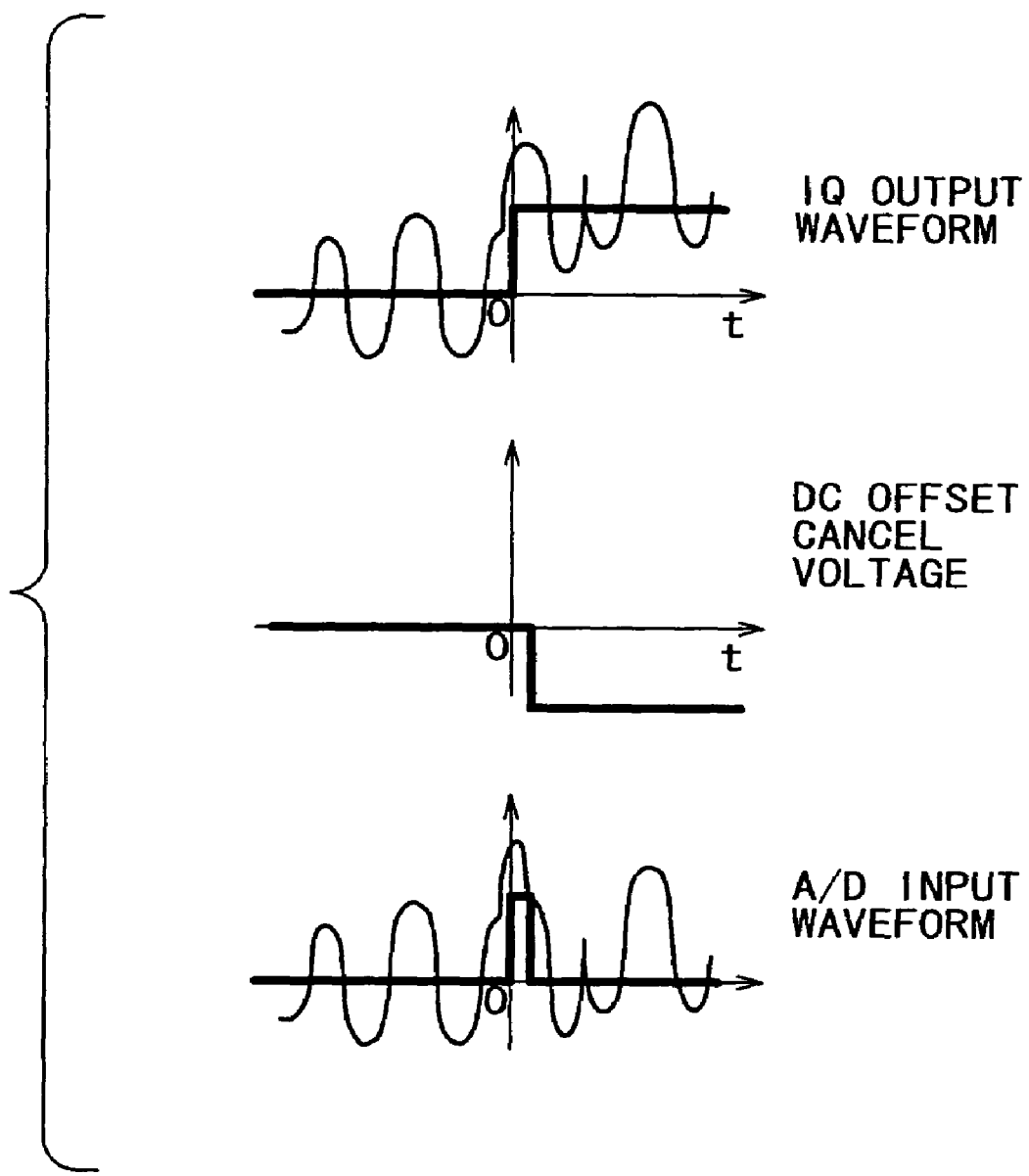
FIG. 7 is a diagram illustrating waveforms which describe a DC offset cancel operation in the present invention.

The PGA control processing block 315 controls the timing by use of a receive slot timing obtained by the finger processing block and path search block 319 such that the PGA data are switched at the beginning of the slot. However, since the sequence of operations of decoding the 3-wire serial digital data 312 by the PGA control circuit 311 to switch the gains of the baseband amplifier 306 in a discrete manner are executed in analog circuits, the timing of the DC offset voltage occurring at the IQ output delicately varies. Thus, it is difficult to provide complete synchronization with the DC offset cancel voltage supplied from the digital-to-analog converter 313. Consequently, there occurs a slight but uncancellable glitch component. This problem may be overcome by capturing the receive data after several tens ns so that this glitch component is not included in averaging the receive level in the receive signal level computing unit 314. If a DPCH signal having spreading factor (SF)=4 has been received for example, the stepwise DC offset component due to the PGA method which deteriorates S/N can be removed without losing the receive data, as compared with the related-art technology, because the data length of one symbol is about 1 microsecond or higher. It should be noted that the value of the elapsed time before starting this receive data capturing may be set as a parameter to the PGA control processing block 315 as desired in advance. FIG. 7 shows the IQ output waveforms in the above-mentioned sequence of operations.

The following examines the DC offset cancel table 316 again. As described above, it is necessary, as described above, for the DC offset cancel table 316 to write beforehand the digital data corresponding to the DC offset voltages at the final stage which occurs when discretely switching gains from the currently set PGA data to the PGA data to be set next. The data amount of this table would reach a considerable amount if all cases of variations from particular PGA data to another particular PGA data are written to the table. In addition, a considerable amount of measurement would be required to make the table. Actually, however, the amount of the data which must be written beforehand can be reduced significantly, which will be described below.

Figure 8:
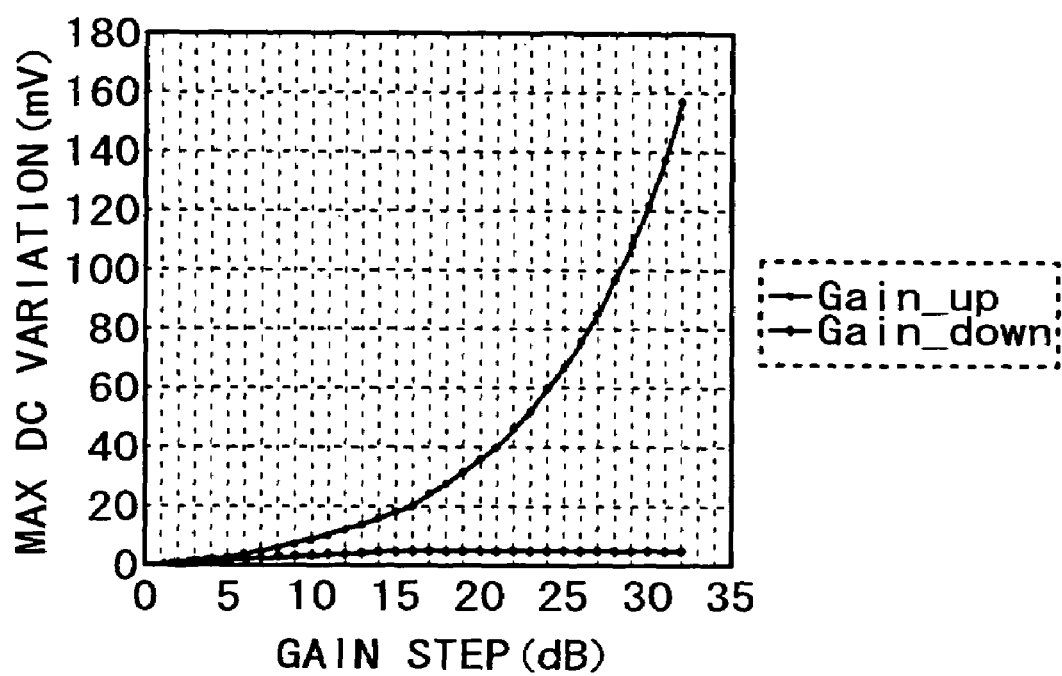
FIG. 8 is a graph indicative of a relationship between a gain step at the time of gain switching and the maximum variation of DC offset.

As described above, a stepwise DC offset occurs due to the fluctuation in the transistor pairs in the differential amplifier sequence constituting the baseband amplifier. Therefore, if the total gain lowers as shown in the graph of FIG. 8, there is little change in the variation of the DC offset voltage at the final stage. Namely, the case in which the total gain increases may only be considered. Consequently, the DC offset cancel table 316 shown in FIG. 10 may be written only when the next PGA data are greater than the current PGA data. Further, as with the PGA control data table 317, the PGA data to be written to the table may be restricted, at maximum, to the data equivalent to the value (40 dB) half the above-mentioned maximum gain.

Figure 1:
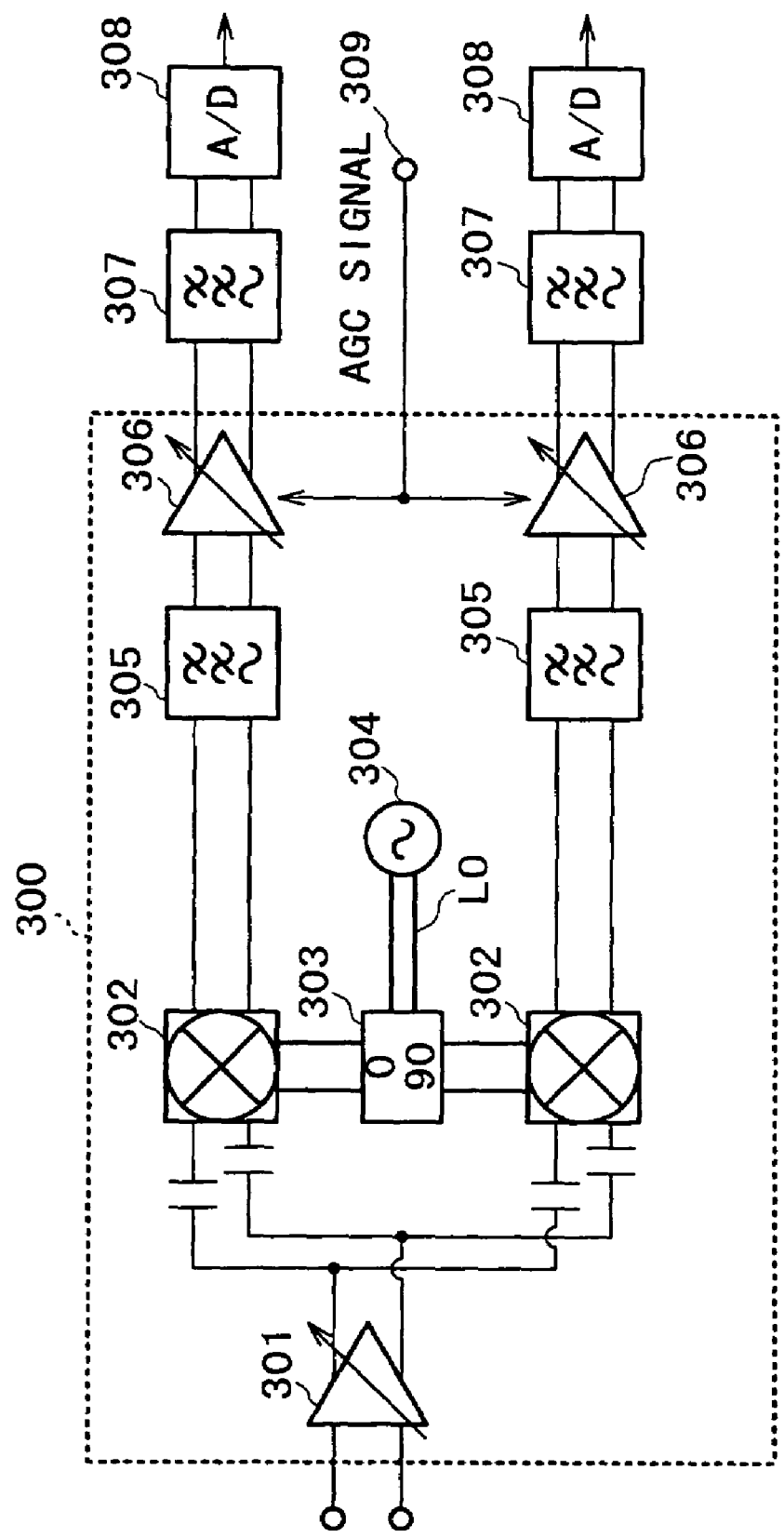
FIG. 1 is a configuration diagram illustrating a related-art direct conversion receiver for use in a DS-CDMA mobile communication system with AGC control done by an analog voltage signal.
Figure 2:
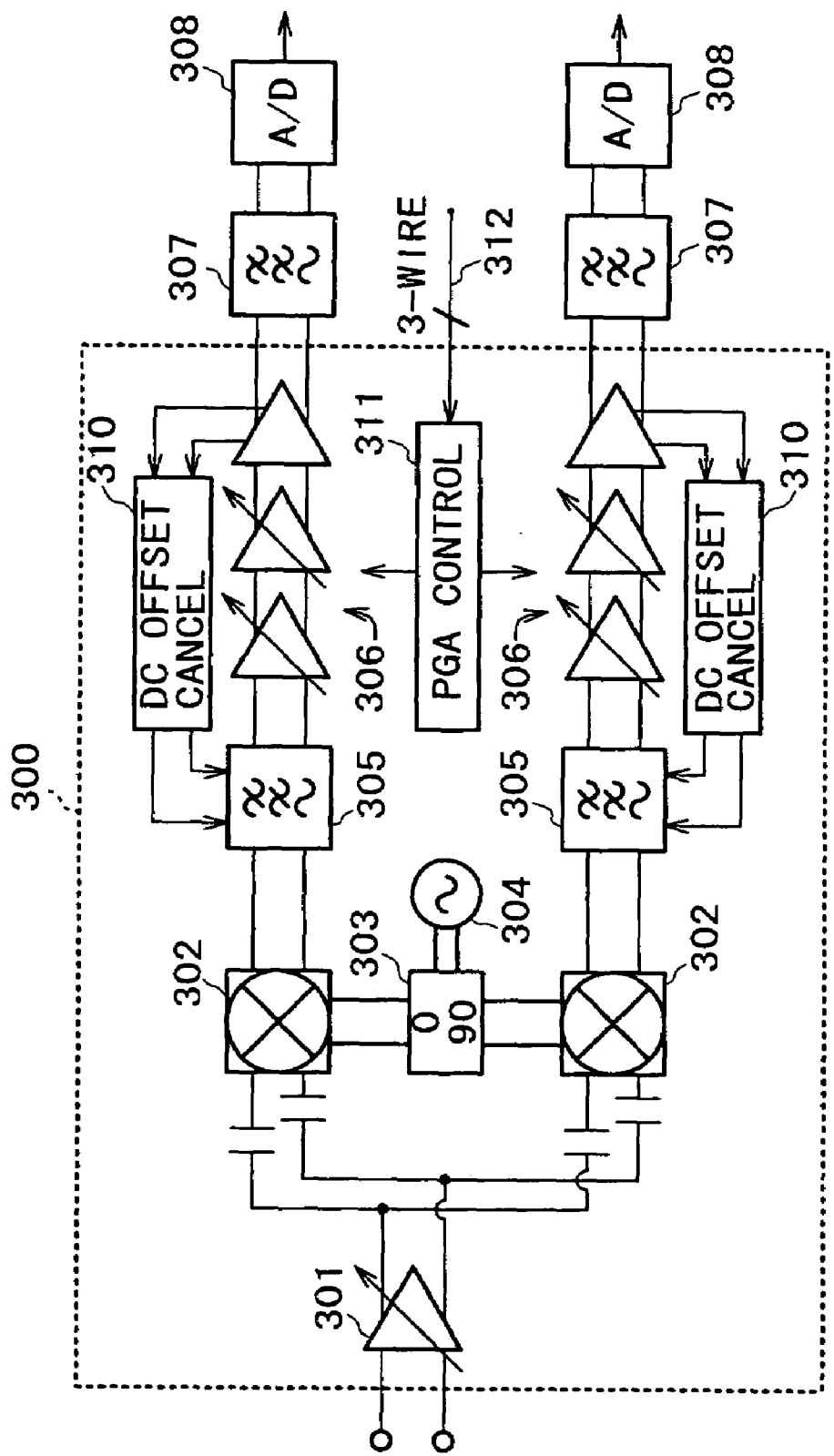
FIG. 2 is a configuration diagram illustrating a related-art direct conversion receiver for use in a DS-CDMA mobile communication system with AGC control done by the PGA method.
Figure 3:
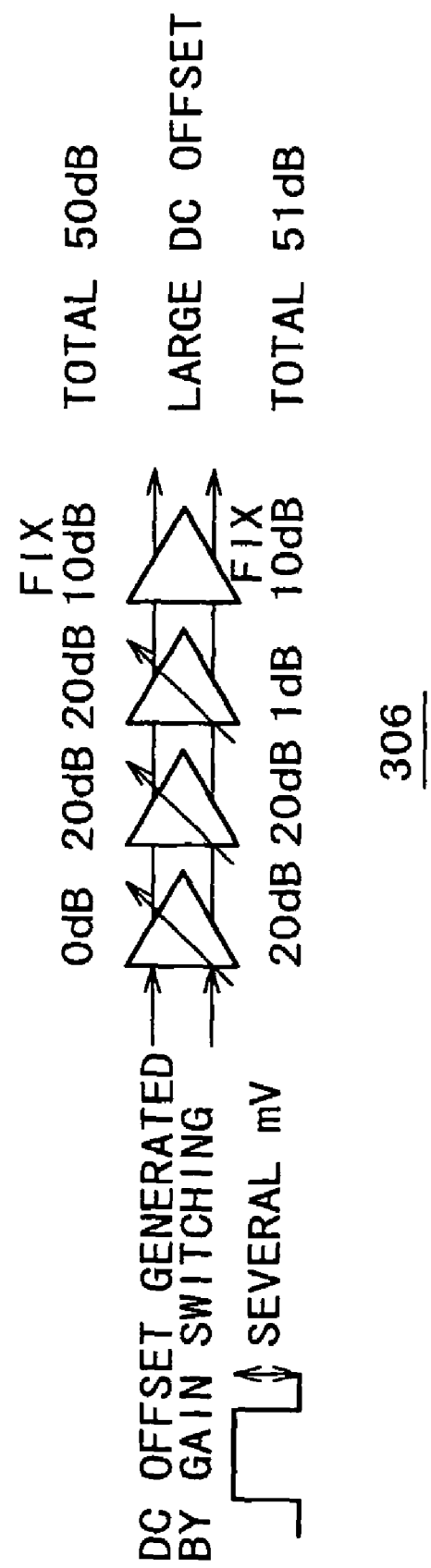
FIG. 3 is a schematic diagram illustrating how a DC offset is generated by gain switching in the PGA method.
Figure 4:
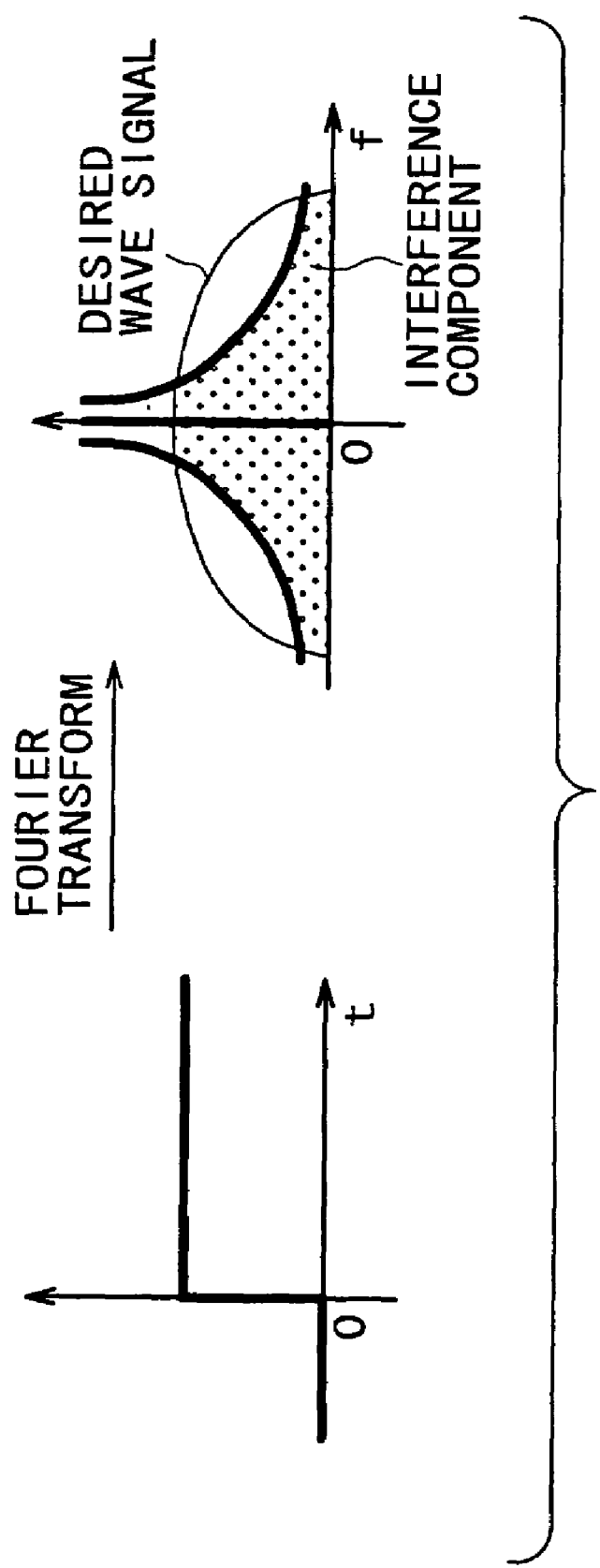
FIG. 4 is a schematic diagram illustrating how a stepwise DC offset component affects a desired wave signal.
Figure 5:
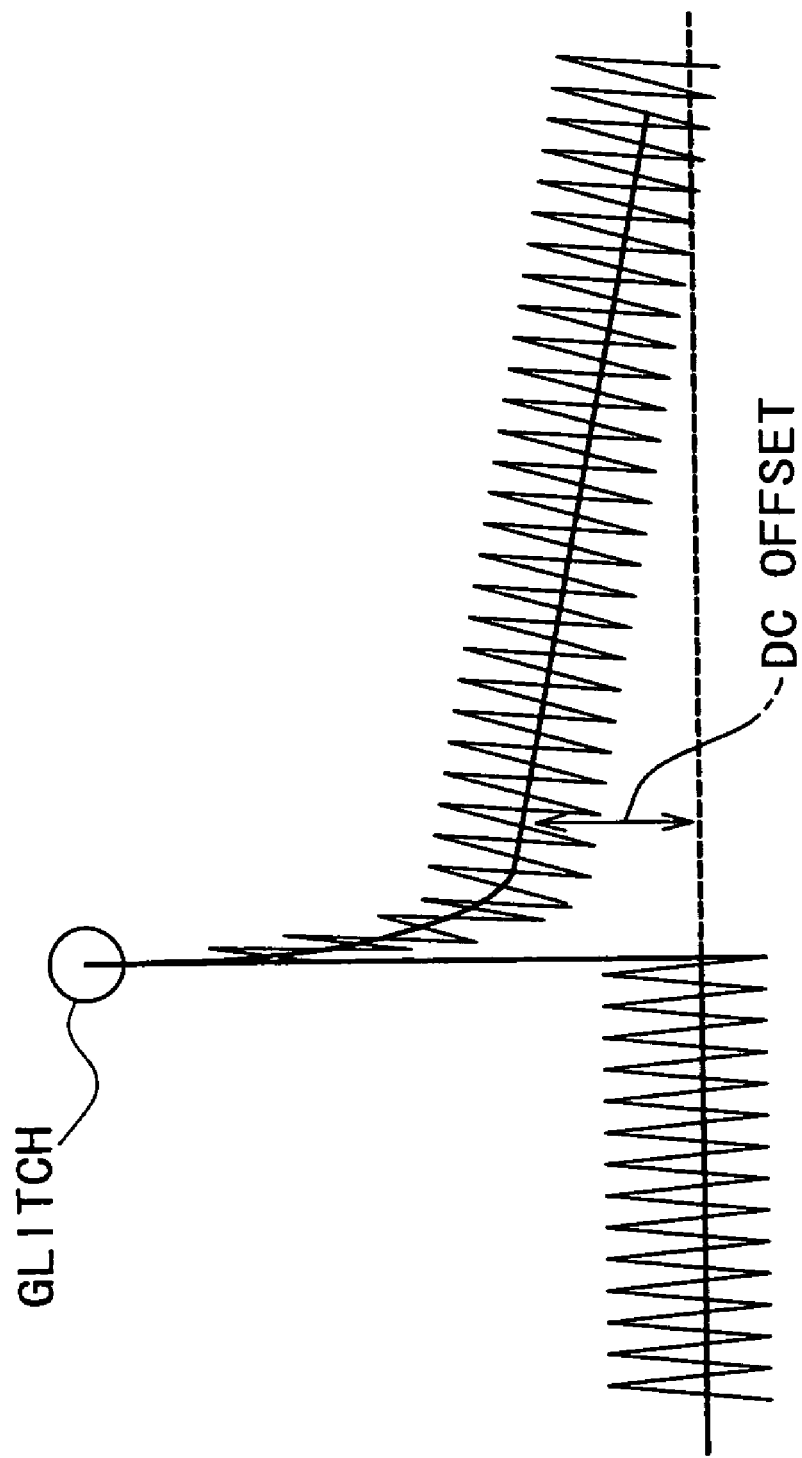
FIG. 5 is a schematic diagram illustrating how gain switching in the PGA method interferes an IQ output waveform.

FIGS. 11A and 11B show another exemplary configuration of the DC offset cancel table 316. In this example, both table 316a and table 316b are used. As seen from the graph of FIG. 8, if the DC offset is determined dependent on the increase in gain, then the DC offset cancel table 316a may be configured such that it is not referenced by the current PGA data and the next PGA data as with the DC offset cancel table 316 in FIG. 10 but it is referenced by the difference between the current PGA data and the next PGA data. In this case, the number of table entries can be reduced significantly. However, it should be noted that combinations of particular current PGA data and next PGA data, though small in number as described above, may exceptionally cause a large DC offset. Namely, in the method in which the gains of the baseband amplifier 306 are discretely switched by decoding through the PGA control circuit 311, a case may occur in which a fairly large DC offset is generated at the final stage even when the gain is varied by 1 dB. This phenomenon takes place only when the gains of the amplifiers constituting the PGA-based baseband amplification block discretely vary largely; for example, this phenomenon takes place in a restricted case where the PGA amplifier of the first stage shown in FIG. 3 is switched in gain from 0 dB to 20 dB. This problem may be overcome by the table 316*b* which separately specifies the offset cancel amounts for the above-mentioned combinations. These combinations of particular current PGA data and next PGA data and the corresponding DC offset amounts have been known by the actual measurement and therefore can be incorporated in the table 316*b* in advance.

Thus, the amount of the data to be written beforehand to the DC offset cancel table 316 can be reduced significantly.

[Second Embodiment]

The second embodiment of the invention is a method for overcoming the problems involved in the related-art analog DC offset cancel operation performed on the stepwise DC offset component caused by digitally setting gains based on the PGA method.

The following describes the second embodiment of the invention with reference to accompanying drawings.

Figure 12:
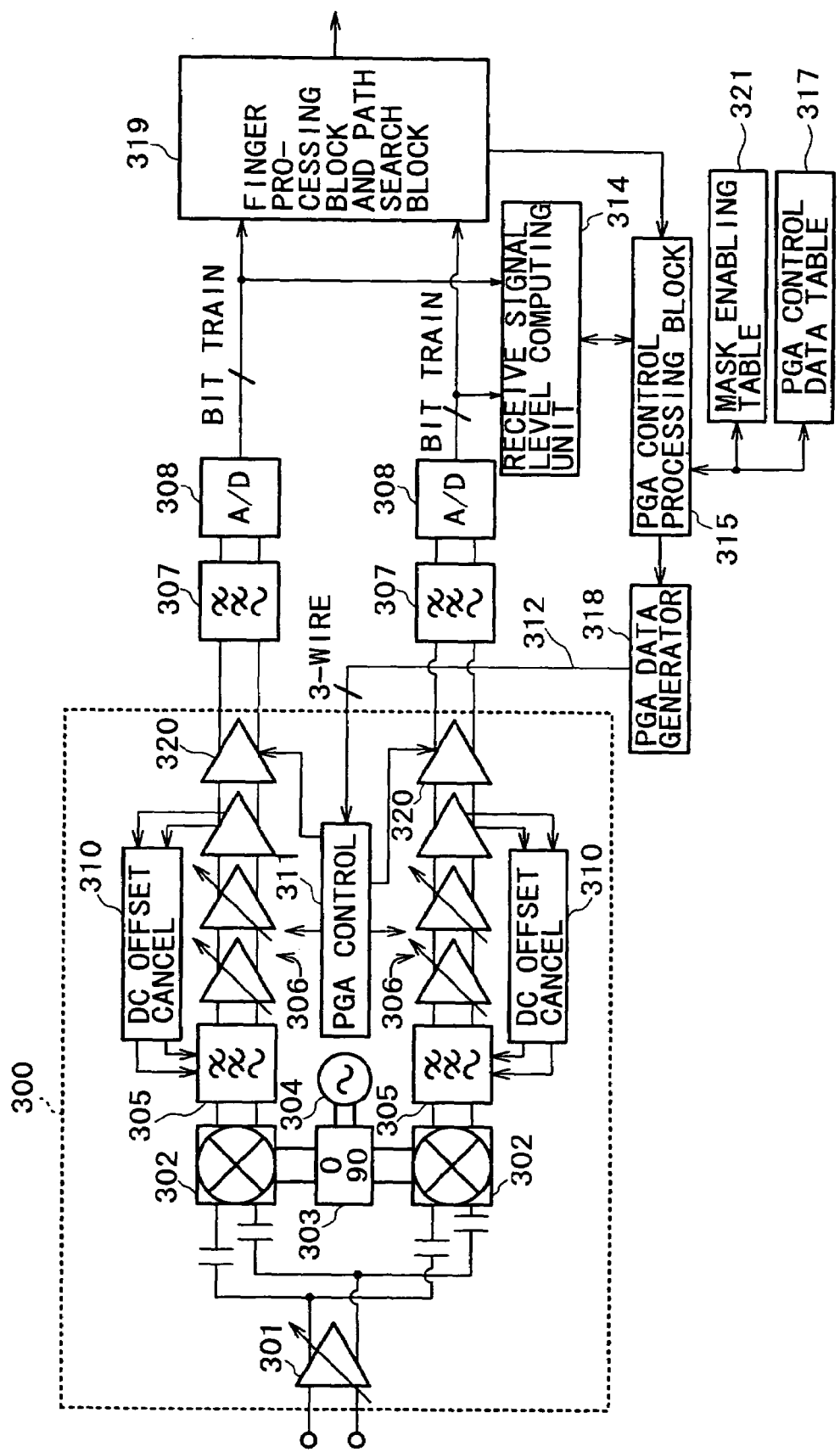
FIG. 12 is a block diagram illustrating an exemplary configuration of a receiver apparatus practiced as a second embodiment of the invention.

Now, referring to FIG. 12, there is shown a block diagram illustrating an exemplary configuration of a receiver apparatus in which a PGA-based direct conversion receiver is used in a DS-CDMA mobile communication system, practiced as the second embodiment of the invention. As shown in FIG. 12, as described in the section regarding the related-art, a signal received by a terminal at its external antenna is differentially amplified by a low-noise amplifier 301 to be divided into two. Each differentially amplified signal is C-cut of its direct-current component, subsequently downconverted from RF signal to baseband signal by a quadrature mixer 302 at a stretch. At this moment, to mix with a signal obtained by dividing an LO signal from a local oscillator 304 into an in-phase component and a quadrature component by a divider 303, an in-phase component signal and a quadrature component signal are generated in the baseband. These baseband signals are removed of an interference wave signal power of an adjacent channel for example by an LPF 305, thereby extracting only a desired wave signal.

Next, 3-wire serial digital data 312 are decoded by the PGA control circuit 311 and the baseband signals are amplified by discretely switching the gains of a baseband amplifier 306. An LPF 307 is a filter inserted to convert a 50% roll-off characteristic downlink signal at the sender side into a 100% roll-off characteristic downlink signal as a total transfer function. The S/N of the baseband signals are maximized by the LPF 307 and then the maximized signals are quantized by an A/D converter 308 from analog to digital. The quantized signals are sent to a finger processing block and path search block 319 which constitutes a baseband signal processing block. In the finger processing block and path search block 319, decode processing including rake synthesis and error correction is performed on the quantized signals, which is not described in detail herein, thereby correctly decoding the downlink signal received from a base station. Concurrently with the processing by the finger processing block and path search block 319, digital signal processing is performed on the IQ baseband signal quantized by the A/D converter 308 by a receive signal level computing unit 314. In computation of the receive signal level, the receive signal level computing unit 314 executes averaging processing to remove the influence of the instantaneous change in the receive envelope level which is Rayleigh-scattered by phasing. This processing is executed, by use of an averaged time as a parameter which can be set as desired by a PGA control processing block 315. This parameter is set on the basis of a simulation or actual measurement data. The operations so far are the same as those of the first embodiment of the invention. It should be noted that the 3-wire serial digital data 312 are generated by a PGA data generator 318 as instructed by a PGA control processing block 315. In the second embodiment, a PGA control data table 317 is also used as with the first embodiment.

The circuitry shown in FIG. 12 also has a DC offset canceller circuit 310 as with the related-art technology and includes a mask hold circuit 320 behind the baseband amplifier 306. This mask hold circuit 320 masks the IQ signal data outputted from the baseband amplifier 306 to hold the DC level.

The following describes the mechanism of the second embodiment.

Problems involved in the PGA-based direct conversion receiver are, as described above, the stepwise DC offset component which deteriorates S/N and the large glitch component which saturates the A/D converter 308 to cause an erroneous AGC control operation. On the other hand, if the LPF cutoff frequency is temporarily raised up to around 100 to 200 kHz for about 10 microseconds to speed up the convergence of DC offset and the IQ signal data for this 10-microsecond period are masked at the output, the problem of the drop of receive data occurs when spreading factor (SF)=4. To circumvent this problem, when a DC offset component large enough for causing S/N deterioration is not generated, the second embodiment turns off the mask hold circuit 320 to output the IQ signal without change and, only when a DC offset component large enough for causing S/N deterioration is generated, the LPF cutoff frequency is temporarily raised to around 100 to 200 kHz for about 10 microseconds as with the related-art technology to speed up the convergence of the DC offset and, at the same time, masks the IQ signal data for this 10-microsecond period at the output. Consequently, the frequency of the drop of receive data can be lowered, thereby preventing the BER/BLER deterioration of the receiver in total.

As described above, the occurrence of a large stepwise DC offset is a phenomenon that takes place in limited cases when the total gain rises and the gains of amplifiers constituting the PGA-based baseband amplification block are discretely switched largely.

Therefore, the actual measurement in advance allows the understanding of stepwise DC offset variation data and a DC offset threshold value which deteriorates S/N due to the stepwise DC offset. Since the PGA control processing block 315 recognizes both the currently set PGA data and the PGA data to be set next, the combinations of current PGA data and next PGA data that cause such DC offsets exceeding this threshold value are stored in a mask enabling table 321 as shown in FIG. 13. When changing the PGA data, the PGA control processing block 315 references the mask enabling table 321 to turn on/off the related-art analog DC offset cancel operation. At the same time, an on/off flag is attached by the PGA data generator 318 to generate the 3-wire serial digital data 312. The 3-wire serial digital data 312 are then decoded by the PGA control circuit 311 incorporated in the direct conversion receiver to turn on the on/off flag only for the combination stored in the mask enabling table 321, thereby enabling the mask processing; for other combinations, the on/off flag is turned off to disable the mask processing.

Instead of the mask enabling table 321, the DC offset cancel table 316 shown in FIG. 10 may be used for the PGA control processing block 315 to compare the offset cancel amount (equivalent to the offset amount) obtained by the table reference with the threshold value, thereby determining whether to perform masking processing. In this case, to be specific, the related-art analog DC offset cancel operation is turned on/off by the threshold value determination by the PGA control processing block 315. At the same time, the on/off flag is attached by the PGA data generator 318 to generate PGA data. Further, the value (1 or 0) of the flag may be held in the table in accordance with the current PGA data and the next PGA data to be referenced by the PGA control processing block 315, thereby obtaining the flag value. Further, in the configuration described above, the mask enabling table 321 stores the combination of current PGA data and next PGA data for enabling the mask processing; conversely, a mask disabling table (not shown) for storing the combination of the PGA data for disabling the mask processing may be arranged. Herein, the mask enabling table and the mask disabling table are generically referred to as a mask table.

As described above, a large glitch component causing a trouble in an AGC control operation usually occurs with a large stepwise DC offset, so that this can be solved by masking the IQ signal data at the output for the period of 10 microseconds, while speeding up the DC offset convergence by temporarily raising the LPF cutoff frequency up to around 100 to 200 kHz for this period of about 10 microseconds as with the related-art technology as described earlier.

[Third Embodiment]

The following describes the third embodiment of the invention. In this embodiment, a mechanism for lowering the frequency of the occurrence of a stepwise DC offset component originally causing S/N deterioration is introduced.

The concept of the third embodiment is as follows. In the actual mobile communication environment, a large increase in the total gain of the baseband amplification block by one session of PGA data setting is not frequent because the averaging processing is executed in the receive signal level computing unit 314 as described earlier. Therefore, an actual problem is a variation of about several dB as a total gain. The case in which this variation causes a stepwise DC offset component that deteriorating S/N is the discrete and large switching of the gain of each amplifier constituting the PGA-based baseband amplification block described with reference to FIG. 3.

Therefore, to prevent the switching of each amplifier from going up to a larger gain variation than that of the related-art technology when the total gain varies by these several dB, the applicant of the present invention conceptualizes that the point at which the PGA gain of each amplifier is discretely switched is provided with hysteresis characteristic.

Figure 14:
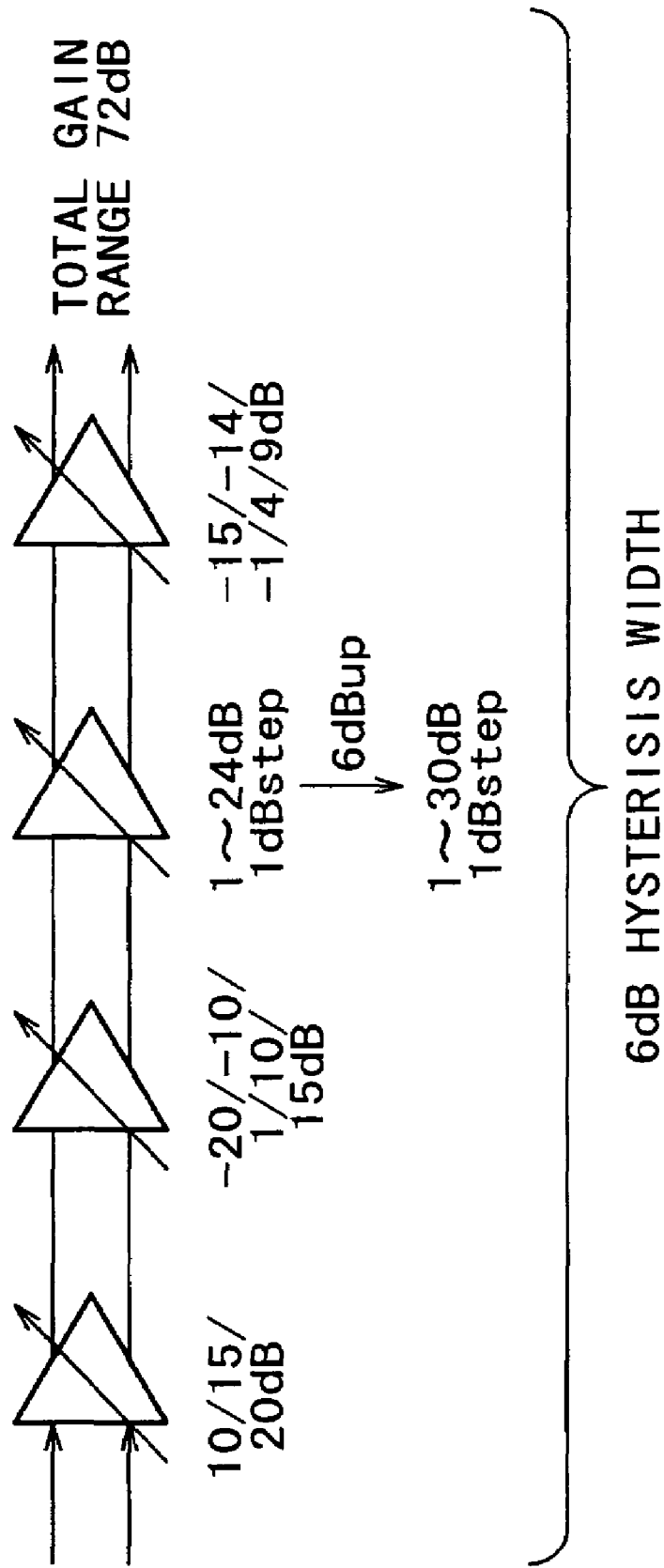
FIG. 14 is a schematic diagram illustrating an exemplary configuration of a PGA baseband amplification block in a third embodiment of the invention.

FIG. 14 shows an exemplary configuration of a PGA baseband amplification block according to the third embodiment. In this example, the PGA amplification block is constituted by four stages of amplifiers, a total gain range being 72 dB. For example, it is assumed that PGA1 discretely switches between gains 10, 15, and 20 dB, PGA2 discretely switches between gains −20, −10, 1, 10, and 15 dB, PGA3 discretely switches between gains 1 to 24 dB in step of 1 dB, and PGA4 discretely switches between gains 1, −14, −1, −15, 9, and 4 dB. In this case, the related-art control method executes the gain switching on each stage as shown in FIG. 15A for the total gain variation of 0 to 72 dB in step of 1 dB. The horizontal axis of the graph indicates the control words equivalent to PGA data, one word being in unit of 1 dB.

Figure 15B:
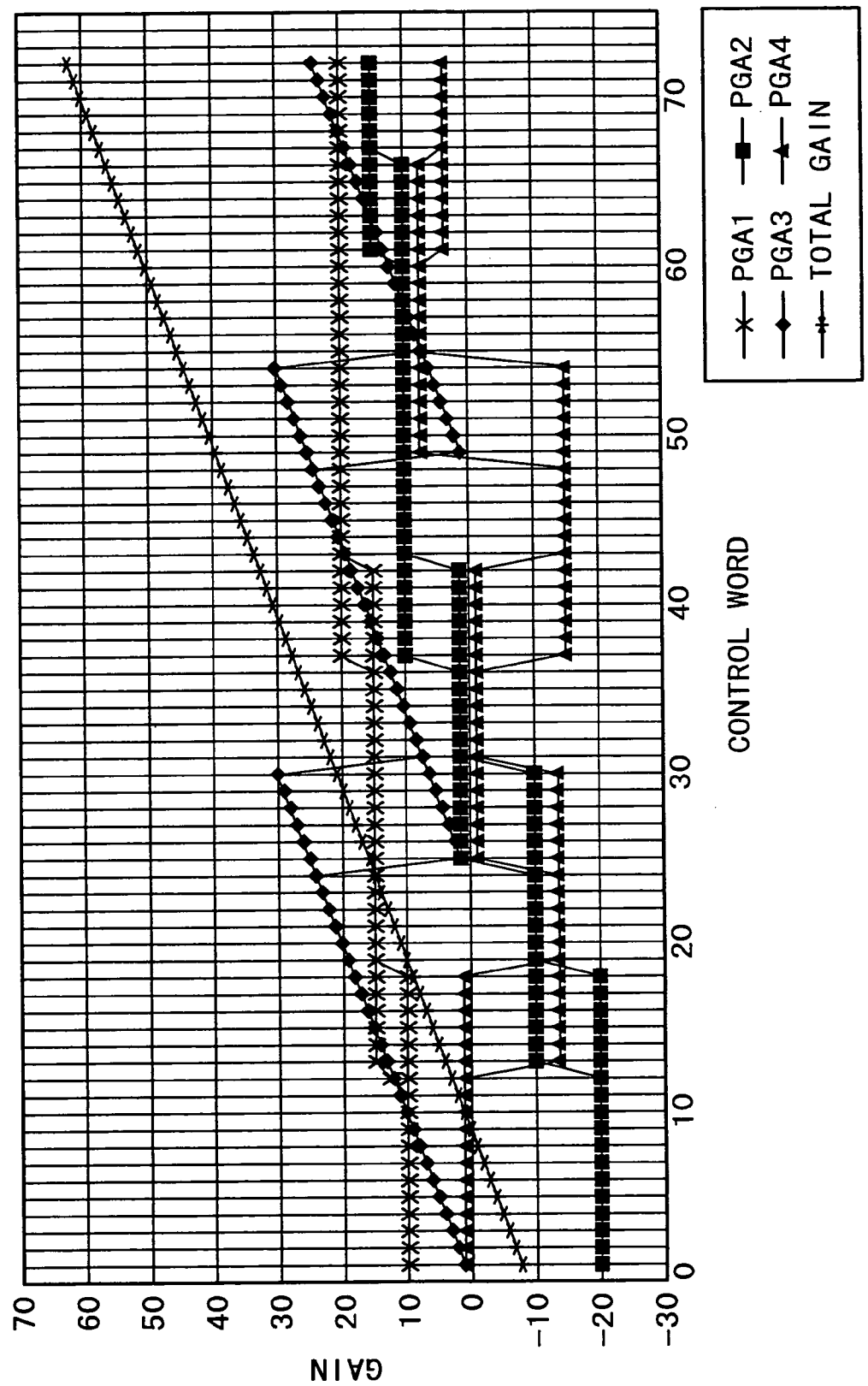
FIG. 15B is a graph indicative of a manner of gain switching of each stage of a baseband amplification block based on a control method in the third embodiment of the invention.

Now, suppose that the gain range of PGA3 which is switched every 1 dB step be expanded by 6 dB to 1 to 30 dB in the baseband amplifier 306 and a hysteresis width of 6 dB is provided to the point at which the gain of each PGA is discretely switched, for example. In this case also, as shown in FIG. 15B, the total gain range is configured as a 1-dB step variable baseband amplification block like that shown in FIG. 15A. Hysteresis denotes that there is a difference in the gain switching control path between going to and coming back; therefore, control is executed such that the path of the side that rejects as much as possible the change from the current status. For example, in the case of PGA2, if the total gain is raised from the 0 dB side, the gain is switched from −20 dB to −10 dB at 12 dB in related-art technologies. With GPA1, GPA3, and GPA4, the gains are switched in conjugation therewith. (It should be noted that, because PGA3 takes charges of the variation in unit of 1 dB among the amplifiers, it is always switched at the switching of the total gain.) The same holds true with the variation in the reverse direction. Namely, if the total gain decreased from 24 dB for example, the gains of all PGAs are switched at 12 dB. Therefore, if a relatively small variation occurs at around 12 dB, the gain switching of all stages takes place frequently. The same holds true with other points of the total gain at which simultaneous switching of plural stages takes place.

However, in hysteresis control, if the total gain increases from the side of 0 dB to over 12 dB in the example of FIG. 15B, the gain switching of PGA1, PGA2, and PGA4 does not take place up to 18 dB of the total gain thanks to hysteresis. The gain rise (6 dB) for that period is carried by PGA3 having the expanded gain variation range. The sequential 1 dB gain variation of only PGA3 does not generate a DC offset large enough for causing a problem. Obviously, if the total gain further rises over 18 dB, it causes the gain variation of all stages, but the frequency at which the simultaneous variation of plural PGAs takes place is reduced because of an allowance of 6 dB. The same holds true with the variation in the reverse direction. For example, if the total gain lowers from 24 dB to 18 dB, the gain switching of PGA1, PGA2, and PGA4 does not occur; only when the total gain lowers below 12 dB, the gain switching of all stages occurs.

Thus, the introduction of hysteresis for the gain switching of each stage significantly lowers the number of points at which the stepwise DC offset for deteriorating S/N takes place, namely the frequency at which the PGA gains are discretely switched. The setting of the hysteresis width of the PGA baseband amplification block is not restricted to 6 dB; for example, the hysteresis width can be set to a desired value by the PGA control processing block 315 in advance. The hysteresis setting is sent with the 3-wire serial digital data 312 as a setting parameter value. The PGA control circuit 311 decodes this PGA data sequence to recognize the parameter value. On the basis of this parameter value, the PGA control circuit 311 can discretely switch the gain of the baseband amplification block 306 by use of the hysteresis width setting. Execution of the above-mentioned sequence of operations allows the lowering of the frequency at which the stepwise DC offset component which originally causes S/N deterioration occurs.

As described and according to the third embodiment of the invention, the mask processing lowers the frequency at which the stepwise DC offset component for originally deteriorating S/N occurs, thereby preventing the deterioration of the BER/BLER of the receiver in total. The third embodiment can be employed independently of or in combination with the above-mentioned first and second embodiments.

While the preferred embodiments of the present invention have been described using specific terms, such description is for illustrative purposes only, and it is to be understood that changes and variations may be made without departing from the spirit or scope of the appended claims.

What is claimed is:

1. A variable gain control circuit for executing automatic-gain-control on a variable gain amplification block composed of a plurality of amplifiers to which gains are discretely set by a programmable-gain-amp method, comprising:
    level detection means for detecting a current amplifier output level;
    programmable-gain-amp control data storage means for storing programmable-gain-amp data corresponding to a difference between a current amplifier output level and a predetermined amplifier output level;
    programmable-gain-amp data generating means for generating programmable-gain-amp data for controlling a gain of said variable gain amplification block on the basis of an output of said programmable-gain-amp control data storage means;
    direct-current offset cancel storage means for storing beforehand direct-current offset cancel data corresponding to a direct-current offset voltage of an amplifier output which occurs when discrete gain switching of said variable gain amplification block is executed from currently set programmable-gain-amp data to programmable-gain-amp data to be set next; and
    control means for referencing said direct-current offset cancel storage means on the basis of currently set programmable-gain-amp data and programmable-gain-amp data to be set next to generate corresponding direct-current offset cancel data; and
    means for converting the generated direct-current offset cancel data into an analog voltage and adds said analog voltage to an amplifier output.

2. The variable gain control circuit according to claim 1, wherein a value which is a half of a maximum gain of said variable gain amplification block is set as an initial value of said programmable-gain-amp data and data to be written beforehand to said programmable-gain-amp control data storage means are restricted to programmable-gain-amp data in which a gain variation is at maximum equivalent to a value which is a half of said maximum gain.

3. The variable gain control circuit according to claim 1, wherein data to be written to said direct-current offset cancel storage means are restricted to data of a case in which a total gain of said variable gain amplification block increases.

4. A variable gain control circuit for executing automatic-gain-control on a variable gain amplification block composed of a plurality of amplifiers to which gains are discretely set by a programmable-gain-amp method, comprising:
    level detection means for detecting a current amplifier output level;
    gain control means for controlling a gain of said variable gain amplification block in accordance with a difference between a current amplifier output level and a predetermined amplifier output level;
    direct-current offset cancel storage means for storing beforehand direct-current offset cancel data corresponding to a direct-current offset voltage of an amplifier output which occurs when discrete gain switching of said variable gain amplification block is executed from currently set programmable-gain-amp data to programmable-gain-amp data to be set next; and
    means for referencing said direct-current offset cancel storage on the basis of currently set programmable-gain-amp data and programmable-gain-amp data to be set next to generate corresponding direct-current offset cancel data and converting the generated direct-current offset cancel data to an analog voltage, thereby canceling a direct-current offset of an amplifier output.

5. The variable gain control circuit according to claim 4, wherein a value which is a half of a maximum gain of said variable gain amplification block is set as an initial value of said programmable-gain-amp data and data to be written beforehand to said programmable-gain-amp control data storage means are restricted to programmable-gain-amp data in which a gain variation is at maximum equivalent to a value which is a half of said maximum gain.

6. The variable gain control circuit according to claim 4, wherein data to be written to said direct-current offset cancel storage means are restricted to data of a case in which a total gain of said variable gain amplification block increases.

7. A variable gain control circuit for executing automatic-gain-control on a variable gain amplification block having an analog direct-current offset cancel circuit and a mask hold circuit for holding a direct-current level by masking an amplifier output, said variable gain control block composed of a plurality of amplifiers to which gains are discretely set by a programmable-gain-amp method, comprising:
    level detection means for detecting a current amplifier output level;
    programmable-gain-amp data generating means for generating programmable-gain-amp data for controlling a gain of said variable gain amplification block and an operation of said mask hold circuit in accordance with a difference between a current amplifier output level and a predetermined amplifier output level; and
    control means for determining whether to execute mask processing by said mask hold circuit in accordance with a result of a comparison between a direct-current offset of an amplifier output which occurs when discrete gain switching of said variable gain amplification block is executed from current set programmable-gain-amp data to programmable-gain-amp data to be set next and a predetermined threshold value, controlling programmable-gain-amp data switching in a predetermined timed relation, determining an on/off status of a direct-current offset cancel operation of said direct-current offset cancel circuit on the basis of the result of said comparison, temporarily speeding up the convergence of a direct-current offset by said direct-current offset cancel circuit only when said direct-current offset exceeds said predetermined threshold value, and controlling said programmable-gain-amp data generating means to execute an operation of masking an amplifier output of a period concerned for a predetermined time.

8. A receiving apparatus for executing automatic-gain-control by a programmable-gain-amp method on a variable gain amplifier in a receiver for use in a mobile communication system, comprising:
    a variable gain amplification block composed of a plurality of amplifiers to which gains are discretely set by a programmable-gain-amp method;
    a receive signal level computing unit for computing a current receive signal level;

a programmable-gain-amp control data table in which programmable-gain-amp data are stored in accordance with a difference between a current receive signal level and a predetermined receive signal level;

a direct-current offset cancel table to which digital data are written beforehand in accordance with a direct-current offset voltage at the last one of said plurality of variable gain amplifiers which occurs when discrete gain switching is executed from currently set programmable-gain-amp data to programmable-gain-amp data to be set next;

a programmable-gain-amp control processing block for generating programmable-gain-amp data for controlling said plurality of variable gain amplifiers by referencing said programmable-gain-amp control data table and generating direct-current offset cancel data by referencing said direct-current offset cancel table; and a digital-to-analog converter for converting said direct-current offset cancel data into an analog voltage and adding said analog voltage to the output of said variable gain amplification block.

9. The receiving apparatus according to claim 8, wherein said programmable-gain-amp control processing block, by use of a receive slot timing information obtained from a baseband signal processing block separately arranged in said receiving apparatus, controls the timing such that programmable-gain-amp data switching takes place at the beginning of a slot, thereby capturing the programmable-gain-amp data as receive data after passing of a time which can be set by a parameter beforehand when receive level averaging processing is executed by said receive signal level computing unit.

10. The receiving apparatus according to claim 8, wherein said programmable-gain-amp control processing block compares a receive signal level computed by said receive signal level computing unit and a predetermined receive signal level, selects from said programmable-gain-amp control data table a programmable-gain-amp value of a gain corresponding to a difference therebetween, and selects, on the basis of the selected programmable-gain-amp control data, digital data corresponding to a direct-current offset voltage which occurs at the last one of said plurality of variable gain amplifiers from said direct-current offset cancel table.

11. The receiving apparatus according to claim 8, wherein said programmable-gain-amp control processing block sets a value which is a half of a maximum gain of said variable gain amplification block as an initial value of programmable-gain-amp data at the time of a power-on sequence, thereby restricting contents to be written beforehand to said programmable-gain-amp control data table and said direct-current offset cancel table to a case in which an increase on the gain becomes at most a half of said maximum gain and a case in which the gains of said plurality of gain amplifiers are discretely switched largely in said gain amplification block.

12. The receiving apparatus according to claim 8, wherein data to be written to said direct-current offset cancel table are restricted to data in which a total gain of said variable gain amplification block increases.

13. A receiving apparatus for executing automatic-gain-control on a variable gain amplifier in a receiver by a programmable-gain-amp method, comprising:

a variable gain amplification block composed of a plurality of amplifiers on which discrete gain setting is executed by a programmable-gain-amp method;

a mask hold circuit for masking an output of an analog direct-current offset cancel circuit arranged in said variable gain amplification block and an output of said variable gain amplification block, thereby holding a direct-current level;

a receive signal level computing unit for computing a current receive signal level;

programmable-gain-amp data generating means for generating programmable-gain-amp data for controlling a gain of said variable gain amplification block and an operation of said mask hold circuit in accordance with a difference between a current receive signal level and a predetermined optimum receive signal level; and control means for determining whether to execute mask processing by said mask hold circuit in accordance with a result of a comparison between a direct-current offset of an amplifier output which occurs when discrete gain switching of said variable gain amplification block is executed from currently set programmable-gain-amp data to programmable-gain-amp data to be set next and a predetermined threshold value, controlling programmable-gain-amp data switching in a predetermined timed relation, determining an on/off status of a direct-current offset cancel operation of said direct-current offset cancel circuit on the basis of the result of said comparison, temporarily speeding up the convergence of a direct-current offset by said direct-current offset cancel circuit only when said direct-current offset exceeds said predetermined threshold value, and controlling said programmable-gain-amp data generating means to execute an operation of masking an amplifier output of a period concerned for a predetermined time.

14. The receiving apparatus according to claim 13, wherein said control means, by use of a receive slot timing information obtained from a baseband signal processing block separately arranged in said receiving apparatus, controls the timing such that programmable-gain-amp data switching takes place at the beginning of a slot, temporarily raises a lowpass filter cutoff frequency to a predetermined frequency for a predetermined time only when said direct-current offset exceeds said threshold value to speed up the convergence of said direct-current offset, and controls said programmable-gain-amp data generating means to execute an operation of masking the output of said variable gain amplification block for this predetermined time.

15. A receiving apparatus for executing automatic-gain-control by a programmable-gain-amp method on variable gain amplification means in a receiver for use in a mobile communication system, comprising:

variable gain amplification means composed of a plurality of amplification means to which discrete gain setting is executed by a programmable-gain-amp method;

receive signal level computing means for computing a current receive signal level;

programmable-gain-amp control data storage means in which programmable-gain-amp data are stored in accordance with a difference between a current receive signal level and a predetermined receive signal level;

direct-current offset cancel storage means to which digital data are written beforehand in accordance with a direct-current offset voltage at the last one of said plurality of amplification means which occurs when discrete gain switching is executed from currently set programmable-gain-amp data to programmable-gain-amp data to be set next;

programmable-gain-amp control processing means for generating programmable-gain-amp data for controlling said plurality of amplification means of said variable gain amplification means by referencing said programmable-gain-amp control data storage means and generating direct-current offset cancel data by referencing said direct-current offset cancel storage means; and digital-to-analog conversion means for converting said direct-current offset cancel data into an analog voltage and adding said analog voltage to the output of said variable gain amplification means.

16. A receiving apparatus for executing automatic-gain-control on variable gain amplification means in a receiver by a programmable-gain-amp method, comprising:

variable gain amplification means composed of a plurality of amplification means on which discrete gain setting is executed by a programmable-gain-amp method;

mask hold means for masking an output of analog direct-current offset cancel means arranged in said variable gain amplification means and an output of said variable gain amplification means, thereby holding a direct-current level;

receive signal level computing means for computing a current receive signal level;

programmable-gain-amp data generating means for generating programmable-gain-amp data for controlling a gain of said variable gain amplification means and an operation of said mask hold means in accordance with a difference between a current receive signal level and a predetermined optimum receive signal level; and control means for determining whether to execute mask processing by said mask hold means in accordance with a result of a comparison between a direct-current offset of amplification means output which occurs when discrete gain switching of said variable gain amplification means is executed from currently set programmable-gain-amp data to programmable-gain-amp data to be set next and a predetermined threshold value, controlling programmable-gain-amp data switching in a predetermined timed relation, determining an on/off status of a direct-current offset cancel operation of said direct-current offset cancel circuit on the basis of the result of said comparison, temporarily speeding up the convergence of a direct-current offset by said direct-current offset cancel means only when said direct-current offset exceeds said predetermined threshold value, and controlling said programmable-gain-amp data generating means to execute an operation of masking amplification means output of a period concerned for a predetermined time.

\* \* \* \* \*